United States Patent
Itoh (10) Patent No.: US 6,489,234 B1
(45) Date of Patent: Dec. 3, 2002

(54) METHOD OF MAKING A SEMICONDUCTOR DEVICE

(75) Inventor: Yoshio Itoh, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/664,764

(22) Filed: Sep. 19, 2000

(30) Foreign Application Priority Data

Oct. 12, 1999 (JP) ............................. 11-289103

(51) Int. Cl.$^7$ ............................. H01L 21/306

(52) U.S. Cl. .................. 438/639; 438/629; 438/700

(58) Field of Search .................. 438/624, 629, 438/639, 700, 947, FOR 196, FOR 355

(56) References Cited

U.S. PATENT DOCUMENTS

| | | | | |
|---|---|---|---|---|
| 4,666,556 A | * | 5/1987 | Fulton et al. | |
| 5,866,435 A | * | 2/1999 | Park | |
| 5,989,977 A | * | 11/1999 | Wu | |
| 6,033,980 A | * | 3/2000 | Liou et al. | |
| 6,180,517 B1 | * | 1/2001 | Liou et al. | |

* cited by examiner

Primary Examiner—Wael Fahmy
Assistant Examiner—Joannie Adelle Garcia
(74) Attorney, Agent, or Firm—Kanesaka & Takeuchi

(57) ABSTRACT

A method of making a semiconductor device includes the steps of etching, with a resist pattern (3) used as a mask, a contact pattern (4) in at least one interlayer insulation film (2) made on a silicon substrate (1); forming on the contact pattern an insulation film (5) containing silicon as a main component; and oxidizing by heat treatment the insulation film to provide an oxide film (6) including a side wall oxide film on an inside wall of the contact pattern.

5 Claims, 10 Drawing Sheets

METHOD OF MAKING A SEMICONDUCTOR DEVICE

BACKGROUND OF THE INVENTION

1. Field of the Invention

The present invention relates to methods of making a semiconductor device (hereinafter "LSI device").

2. Description of the Related Art

An LSI device has many technical requirements such as high-speeds, low power consumption, versatile functions, and high integration degrees, and it is necessary to develop a circuit pattern which has no less functions and/or better electrical characteristics at a smaller occupied area than those of the current LSI devices.

In the process for making LSI devices, a number of treatments or photolithographic techniques (hereinafter "lithographic techniques") are applied to the surface of a semiconductor silicon wafer (hereinafter "wafer") to form a microscopic circuit pattern thereon.

A photoresist pattern corresponding to the circuit pattern formed by lithographic technique is used as a masking material to perform etching a thin film material or injecting an impurity ion. By repeating such treatments for a number of times, a desired LSI circuit pattern is formed.

However, the resolution with which the microscopic circuit pattern is formed in the lithographic technique and the circuit pattern is positioned on the layer is approaching the limit. Consequently, the formed photoresist pattern fails to meet the required working precision for the LSI circuit pattern.

Figure 2A:
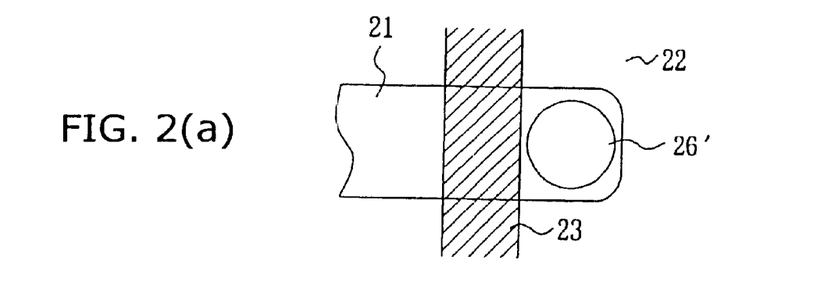
FIGS. 2(a)–(d) are top plan views showing some problems with LSI fabrications.
Figure 3A:
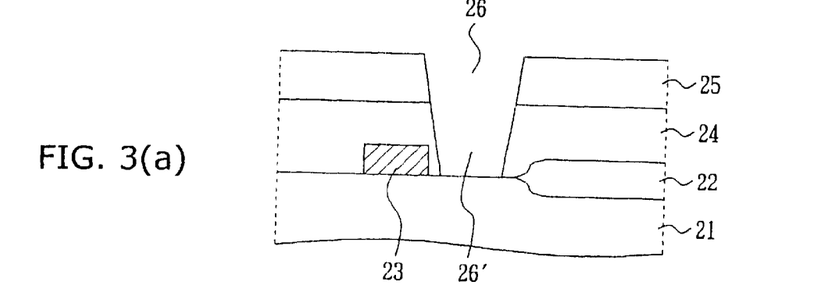
FIGS. 3(a)–(d) are sectional views showing the same problems as in FIGS. 2(a)–(d)

In FIGS. 2(a) and 3(a), a silicon monocrystal substrate (hereinafter "silicon substrate") is indicated by reference numeral 21. A field oxide ($SiO_2$) film 22 having a thickness of 2000–8000 Å is formed by the well known LOCOS process. A channel stopper or impurity diffusion region (not shown) is provided in the silicon substrate 21 to form an electrical insulation region.

An electrode pattern 23 is made from a polycrystal silicon (hereinafter "polysilicon") having a thickness of 1000–4000 Å or a film containing a metal of high melting point, such as tungsten, molybdenum, or titanium, or a eutectic film of silicon and a metal having a high melting point. A thin silicon oxide film (not shown) having a thickness of 50–500 Å is made under the electrode pattern 23.

An interlayer insulation or oxide film 24 having a thickness of 1000–8000 Å is formed. A photoresist film 25 is formed by the lithographic technique to provide a photoresist pattern 26. The photoresist film 25 is used as a mask to etch a contact pattern or hole 26' in the interlayer insulation film 24.

Problems arising from the fact that the lithographic technique reaches its precision limit will be described with reference to FIGS. 2(b)–(d) and 3(b)–(d).

Figure 2B:
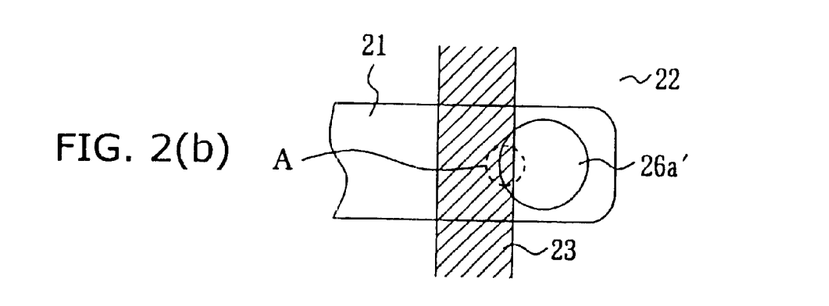
Figure 3B:
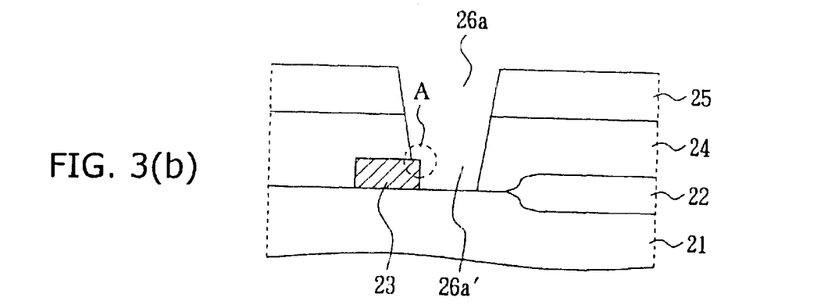

In FIGS. 2(b) and 3(b), the photoresist pattern 26a formed by the lithographic technique is slightly offset from the underground pattern to make contact with the electrode pattern 23.

Consequently, a portion of the contact pattern 26a' is formed on the edge of the electrode pattern 23. As a result, a wiring material formed within the contact pattern 26a' makes contact with the electrode pattern 23 as shown by A in FIG. 3(b), providing a electrical circuit failure or defect LSI device.

This problem results from the fact that the photoresist pattern 26a is formed at a slightly offset position by the lithographic technique. This problem has been negligible in making LSI devices having a circuit pattern dimension of 0.5 μm or more. However, this problem is no longer negligible for a circuit pattern dimension of 0.4 μm or less.

Figure 2C:
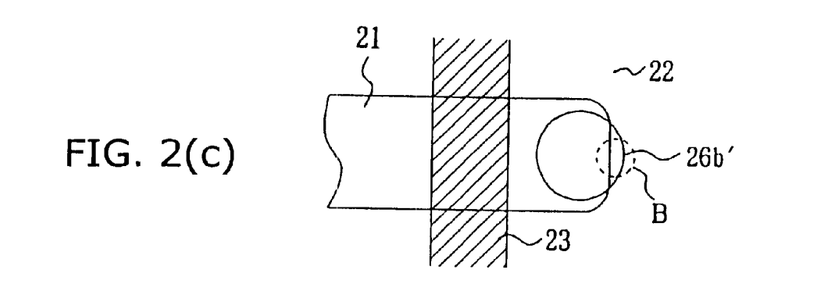
Figure 3C:
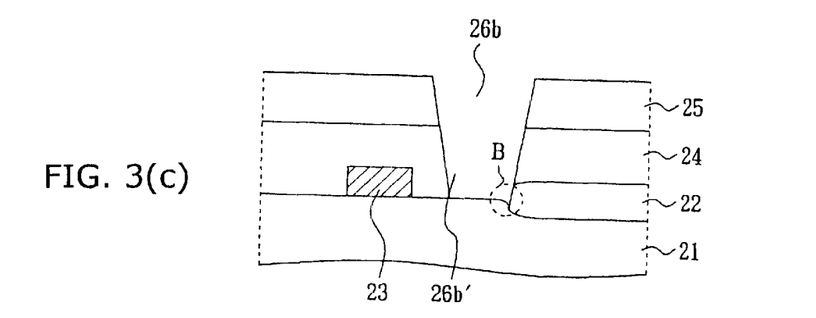

In FIGS. 2(c) and 3(c), the contact pattern 26 is slightly offset in the direction opposite to that of FIGS. 2(b) and 3(b). The contact pattern 26b formed on the photoresist film 25 is offset from the electrode pattern 23 and laid on the edge of the field oxide film 22. Consequently, the contact pattern 26b' formed in the interlayer insulation film 24 cuts a portion of the field oxide film 22 as shown by B in FIG. 3(c). As a result, a portion of the channel stopper (not shown) formed under the field oxide film 22 is exposed.

When a wiring material is formed, the exposed portion is prone to an electrical leak to the silicon substrate 21, providing a defective LSI device.

Figure 2D:
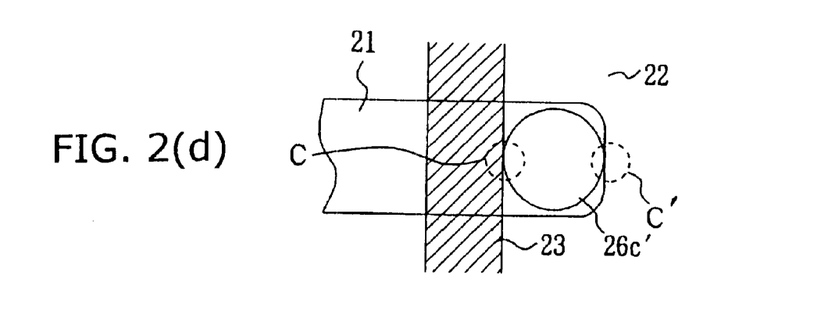
Figure 3D:
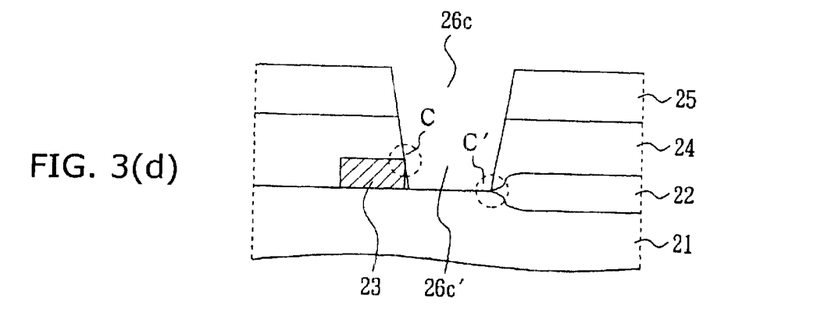

In FIGS. 2(d) and 3(d), the contact pattern 26c formed on the photoresist film 25 is larger than the designed pattern. Similarly to the problems in FIGS. 2(b), 2(c), 3(b), and 3(c), the wiring material formed within the contact pattern 26c' makes connection with the electrode pattern 23 as shown by C in FIG. 3(d) or allows an electrical leak from the field oxide film 22 to the silicon substrate 21 as shown by C' in FIG. 3(d).

In addition, the precision problem, such as the too large contact pattern 26c', reduces the tolerance for positioning offset so that the yield of LSI devices is reduced by both of the factors of positioning and dimension precision. A number of measures for minimizing these disadvantages have been proposed.

A representative example will be described with reference to FIGS. 4(a)–(d).

Figure 4A:
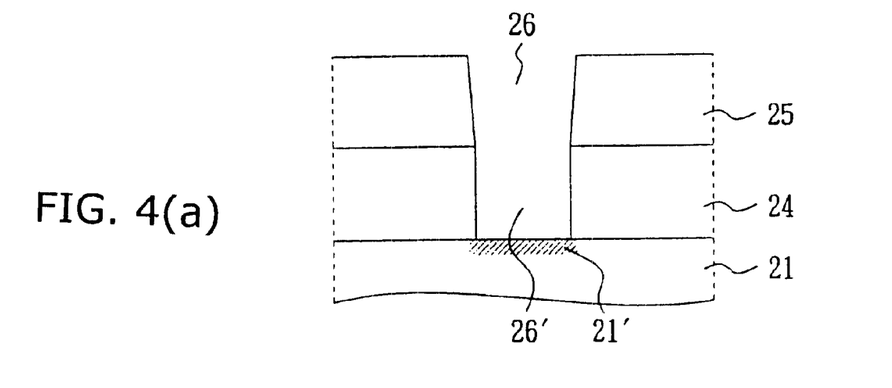
FIGS. 4(a)–(d) are sectional views showing how to make an LSI device according to the first conceived method.

In FIG. 4(a), reference numeral 21 denotes a semiconductor substrate, 24 an interlayer insulation film, 25 a photoresist film, 26 a photoresist pattern formed in the photoresist film 25, and 26' a contact pattern formed in the interlayer insulation film 24.

A substrate portion 21' is exposed by etching the interlayer insulation film 24, and its surface is slightly damaged by the etching process. This damage is omitted in FIGS. 2(a)–(d) and 3(a)–(d).

Figure 4B:
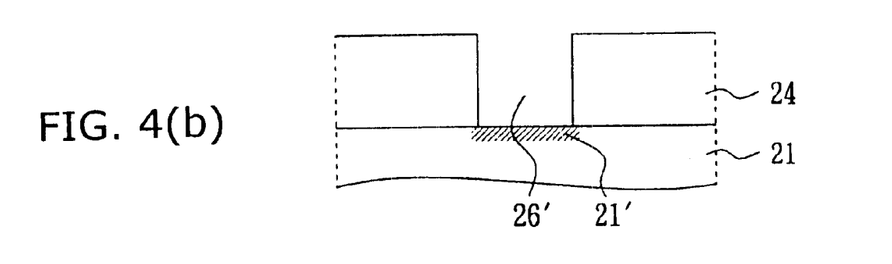

In FIG. 4(b), the photoresist film 25 is removed.

Figure 4C:
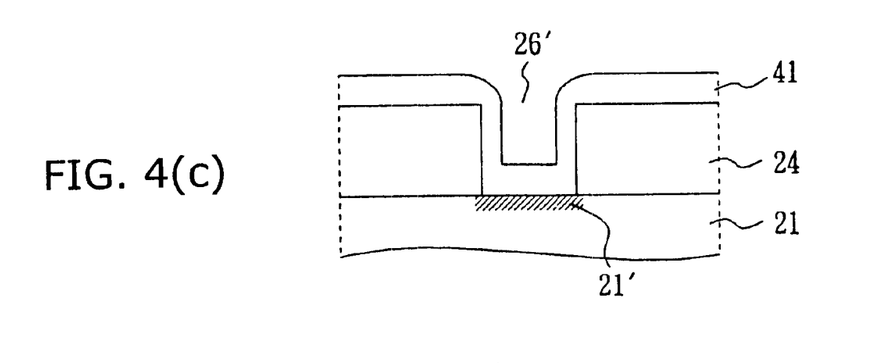

In FIG. 4(c), an insulation film material or silicon oxide film 41 is formed on the interlayer insulation film 24 and within the contact pattern 26' by the chemical vapor deposition (CVD) process to a thickness of 600–4000 Å.

Figure 4D:
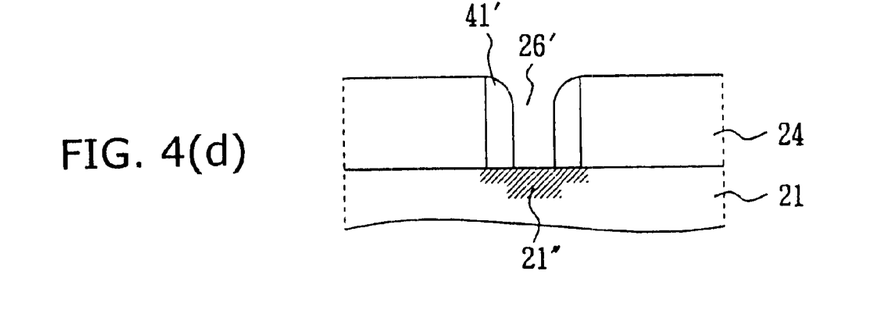

In FIG. 4(d), an anisotropic etching process is applied to the entire surface of the oxide film 41 to proceed in the perpendicular direction (hereinafter "etchback process"). Consequently, only the oxide films 41' on the side walls of the contact pattern 26' remain.

Consequently, the diameter of the contact pattern or hole 26' is reduced by the side wall oxide films 41' to thereby minimize the above problems in FIGS. 2 and 3. In this method, however, the silicon substrate portion 21" is exposed again upon formation of the side wall oxide film 41' so that the etching damage is accumulated.

In addition, the thickness of the side wall oxide film 41' is determined by the thickness of the oxide film 41 formed by the CVD process, which in return determines the effective size of the final contact pattern 26'. Consequently, in order to minimize the problems of FIGS. 2 and 3 by reducing the size of the contact pattern 26', it is desired to form a thick oxide film 41 by the CVD process.

Figure 5A:
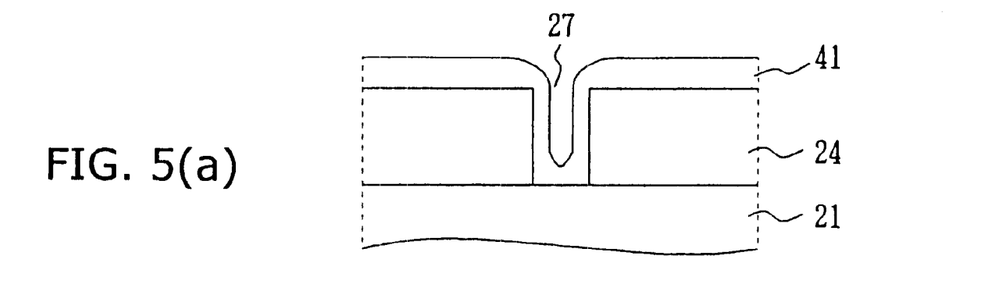
FIGS. 5(a)–(b) are sectional views showing how to make an LSI device according to the second conceived method.
Figure 5B:
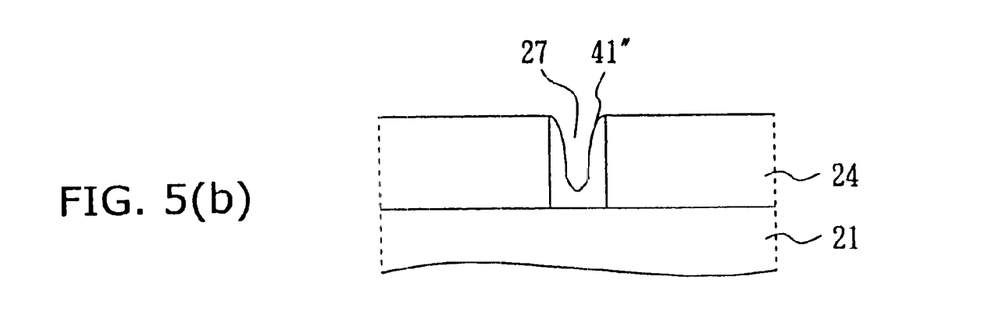

However, the contact pattern 26' itself is very small and can be formed too small to provide satisfactory etchback process as shown at 27 in FIG. 5(a) owing to the precision problem of the lithographic technique. Consequently, a defective opening 41" of the contact pattern 27 can be made as shown in FIG. 5(b).

The defective opening 27 can also result from variations in the thickness of the oxide film 41 formed by the CVD process, leading to a defective LSI device.

If the etchback process is increased to reduce the frequency that the defective opening of the contact pattern 27 is produced, the damage to the substrate portion 21" exposed by the etching process in FIG. 4(d) increases.

The damage, which appeared to be caused by impurities injected in the etching process or crystal defect produced in the silicon substrate 21, increases variations in the electrical resistance at the contact or increases the electrical resistance. Such variations in the electrical resistance are no longer negligible for submicron technology.

In order to reduce the number of defective openings of the contact pattern and variations in the electrical resistance at the contact area, it is necessary to reduce the thickness of the oxide film 41 formed by the CVD process. However, such reduction of the oxide film 41 is disadvantageous for solving the problems of FIGS. 2 and 3.

That is, the measure of FIG. 4(d) is not fully satisfactory, and there is a need for further improvement.

SUMMARY OF THE INVENTION

Accordingly, it is an object of the invention to provide a method of making a semiconductor device, which is capable of minimizing the etching dimension of a contact pattern formed in an insulation film without changing the lithographic technique.

According to the invention there is provided a method of making a semiconductor device, comprising the steps of etching, with a resist pattern used as a mask, a contact pattern in at least one interlayer insulation film made on a silicon substrate; forming on the contact pattern an insulating film containing silicon as a main component; and oxidizing by heat treatment the insulation film to form an oxide film including a side wall oxide film on an inside wall of the contact pattern.

According to an embodiment of the invention, the etching step is made such that the etching pattern does not reach the silicon substrate.

According to another embodiment of the invention, the etching step makes use of a difference in etching speed between the interlayer insulation films.

According to still another embodiment of the invention, the interlayer insulation films are a nitride film and an interlayer oxide film beneath the nitride film, with the contact pattern formed in the nitride film, and the method further comprising the step of applying, subsequent to formation of the side wall oxide films, a blanket etchback process to simultaneously etch the interlayer oxide film.

According to yet another embodiment of the invention, the interlayer insulation films are an oxide film and a nitride film beneath the oxide film, with the contact pattern formed in the oxide film, and the method further comprising the step of applying, subsequent to formation of the side wall oxide films, a blanket etchback process, followed by etching the nitride film.

According to another embodiment of the invention, the interlayer insulation films are a first interlayer oxide film, a nitride film, and a second interlayer oxide film, with the contact pattern formed in the first oxide film, and the method further comprising the step of applying, subsequent to formation of the side wall oxide film, a blanket etchback process, followed by etching the nitride and second interlayer oxide films.

According to still another embodiment of the invention, the interlayer insulation films are a first interlayer oxide film, a nitride film, and a second interlayer oxide film, with the contact pattern formed in the first oxide and nitride films, the method further comprising the step of applying, subsequent to formation of the side wall oxide film, a blanket etchback process to simultaneously etch the second interlayer oxide film.

BRIEF DESCRIPTION OF THE DRAWINGS

FIGS'. 9(a)–(b) are sectional views showing steps of making an LSI device according to the fifth embodiment of the invention.

DESCRIPTION OF THE PREFERRED EMBODIMENTS

The first embodiment for making an LSI device will now be described with reference to FIGS. 1(a)–(d).

Figure 1A:
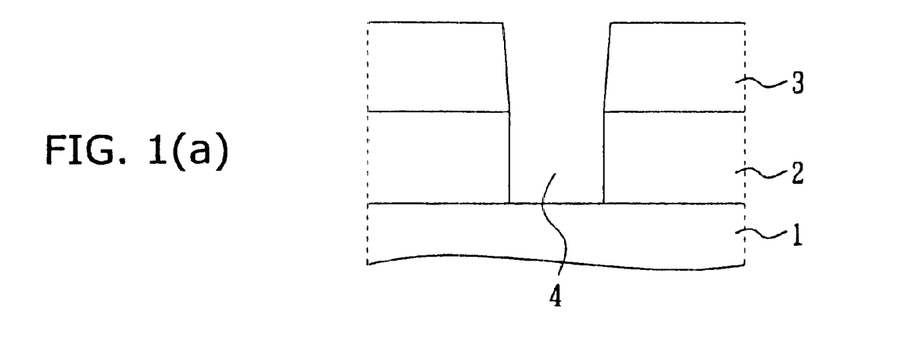
FIGS. 1(a)–(d) are sectional views showing how to make an LSI device according to a first embodiment of the invention.

In FIG. 1(a), reference numeral 1 denotes a semiconductor substrate, 2 an interlayer insulation film, 3 a photoresist film, and 4 a contact pattern.

Figure 1B:
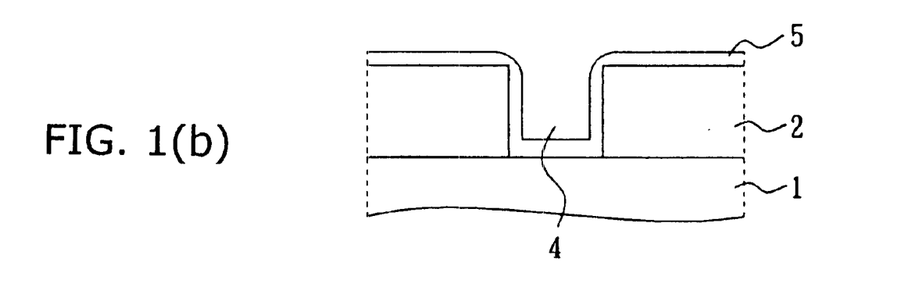

In FIG. 1(b), the photoresist film 3 is removed, and an amorphous silicon (hereinafter "a-silicon") or polycrystal silicon (hereinafter "polysilicon") film 5 is formed on the entire surface of the interlayer insulation film 2 and the contact pattern 4 to a thickness of 300–2000 Å by the CVD or sputter process.

Figure 1C:
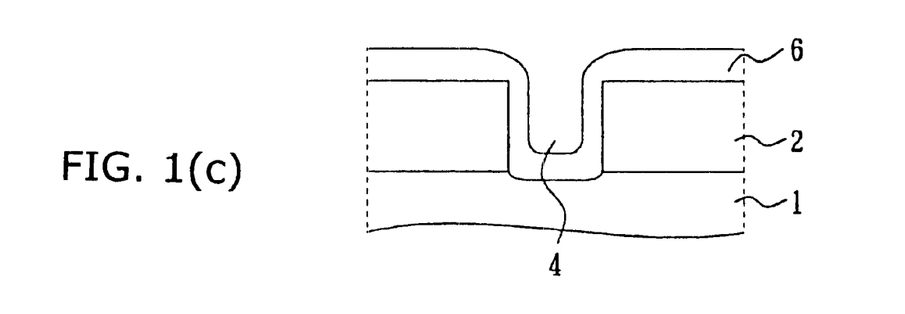

In FIG. 1(c), it is subjected to a heat treatment at temperatures between 800 and 1200 degrees C. to completely oxide the silicon film 5 forming a $SiO_2$ film 6. A supply of silicon atom is provided from the silicon substrate 1 through the bottom of the contact pattern 4 so that the $SiO_2$ film 6 can be somewhat thicker there than the remaining part. This heat treatment helps it to recover from the damage caused by the etching process upon formation of the contact pattern 4 and generally is called "healing treatment".

Figure 1D:
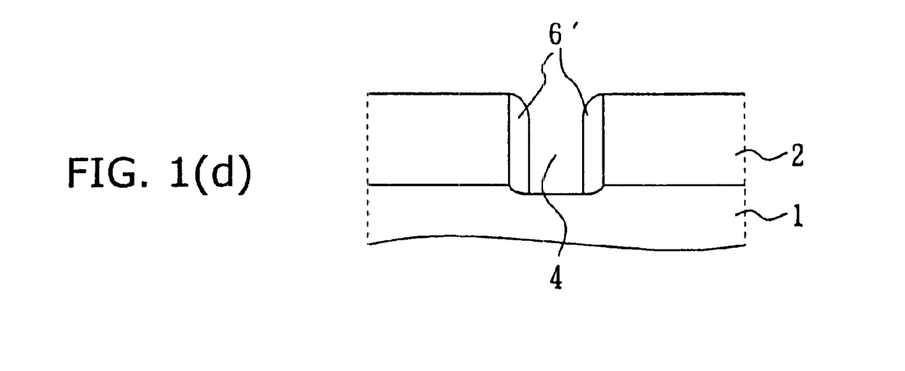

In FIG. 1(d), a blanket etchback process is applied to form $SiO_2$ films 6' on the side walls of the contact pattern 4. The side wall $SiO_2$ films 6' made according to the first embodiment help solve such problems that the resist pattern formed by the lithographic technique is offset slightly from the underground position and slightly larger than the designed dimension. The silicon film 5 formed on the entire surface of the contact pattern 4 is not thicker than a half of the thickness of the conventional $SiO_2$ film 41 so that it is possible to reduce the influence of variations in the film thickness. By the way, a range of variations in the thickness of $SiO_2$ films formed by thermal oxidation is narrower than that of films formed by the CVD process.

As a result, it is possible to reduce the frequency that the defective opening is produced. In addition, the damaged portion on the bottom of the contact pattern 4 is healed by the heat treatment, thereby making a contribution to stabilize the electrical resistance at the contact area. That is, according to the first embodiment, it is possible to simultaneously solve the precision (positioning and dimensional precision) problems with the lithographic technique and the related electrical problems.

The second embodiment of the invention will be described with reference to FIGS. 6(a)–(d).

Figure 6A:
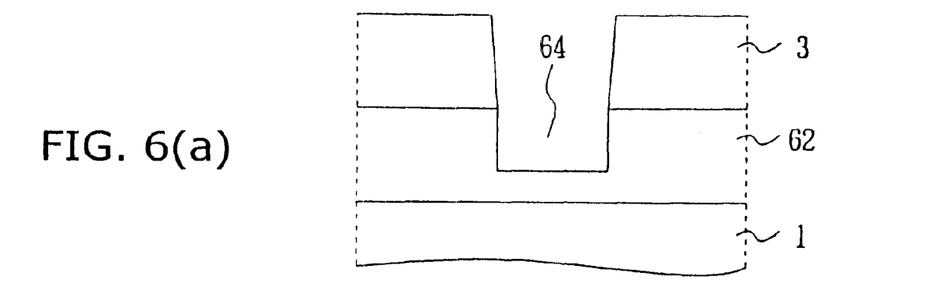
FIGS. 6(a)–(d) are sectional views showing steps of making an LSI device according to the second embodiment of the invention.

In FIG. 6(a), reference numeral 1 denotes a semiconductor substrate, 62 an interlayer insulation film, and 3 a photoresist film. In this embodiment, the etching of the interlayer insulation film 62 does not reach the silicon substrate 1. That is, the $SiO_2$ film remain at the bottom of the contact pattern 64.

Figure 6B:
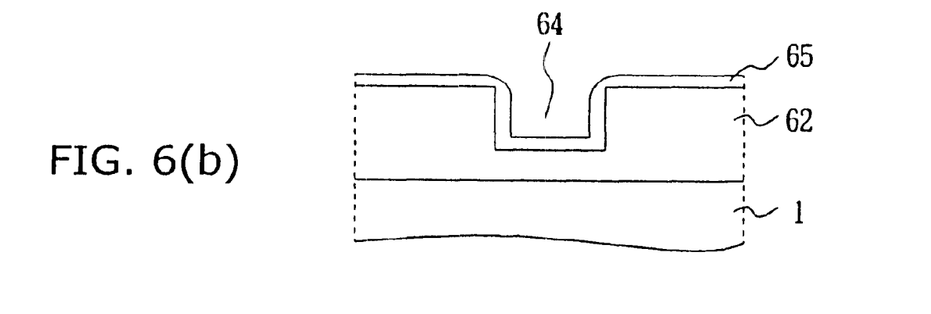

In FIG. 6(b), the photoresist film 3 is removed, and a silicon film 65 is formed on the entire surface as in FIG. 1(b).

Figure 6C:
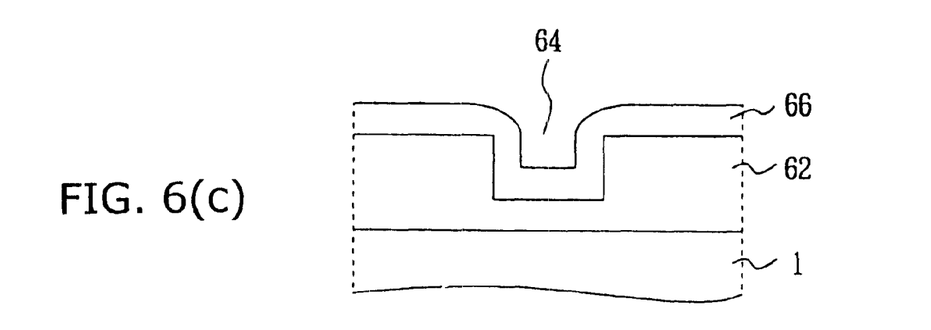

In FIG. 6(c), the silicon film 65 is oxidized by a heat treatment to form a $SiO_2$ film 66 as in FIG. 1(c).

Figure 6D:
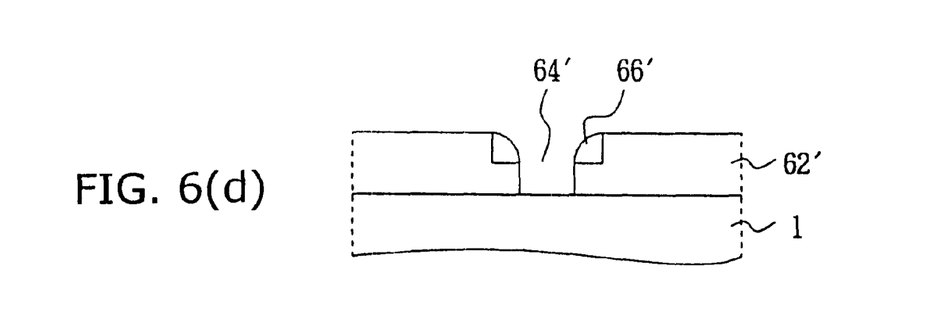

In FIG. 6(d), a blanket etchback process is applied to form a final contact pattern 64'. The form of $SiO_2$ films 66' on the side walls of the contact pattern 64 is a little different from that of the $SiO_2$ film 6' of FIG. 1(d).

In the second embodiment, the etching of the contact pattern 64 does not reach the silicon substrate 1 so that little damage is made to the substrate 1; that is, the influence of damage is further reduced in comparison with the first embodiment. Since the thickness of the $SiO_2$ film up to the silicon substrate 1 is larger, it is necessary to set a longer etchback time. Consequently, the thickness of the interlayer insulation film 62' after formation of the final contact pattern 64' is smaller by that much. However, this problem is negligible by increasing the initial thickness of the interlayer insulation film 62.

The third embodiment of the invention will be described with reference to FIGS. 7(a)–(d).

Figure 7A:
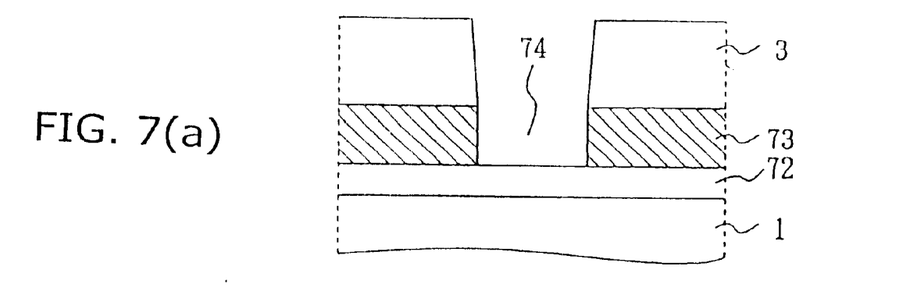
FIGS. 7(a)–(b) are sectional views showing steps of making an LSI device according to the third embodiment of the invention.

In FIG. 7(a), reference numeral 1 denotes a semiconductor substrate, 72 a first interlayer insulation film or $SiO_2$ film having a thickness of 1000–4000 Å, 73 a second interlayer insulation film or nitride (SiN) film having a thickness of 1000–6000 Å, and 3 a photoresist film. A contact pattern 74 is not formed on the first interlayer insulation film or $SiO_2$ film 72 but the SiN film 73.

Figure 7B:
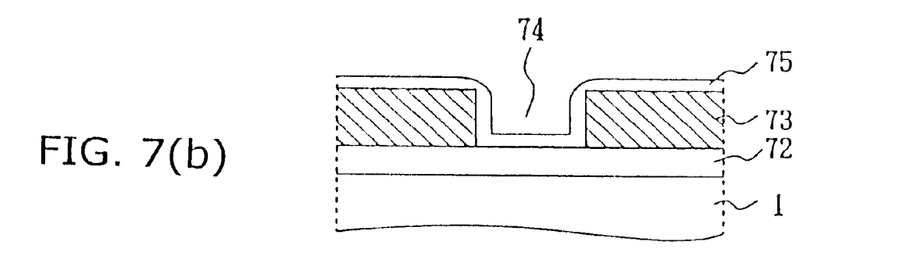

In FIG. 7(b), the photoresist film 3 is removed, and a silicon film 75 is formed on the entire surface as in FIG. 1(b).

Figure 7C:
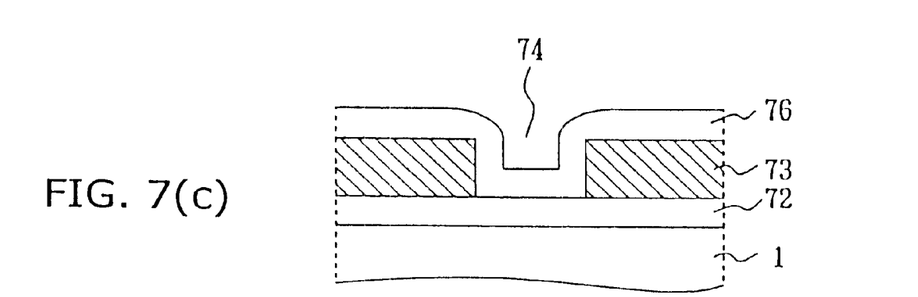

In FIG. 7(c), the silicon film 75 is oxidized completely by heat treatment to form a $SiO_2$ film 76 as in FIG. 1(c).

Figure 7D:
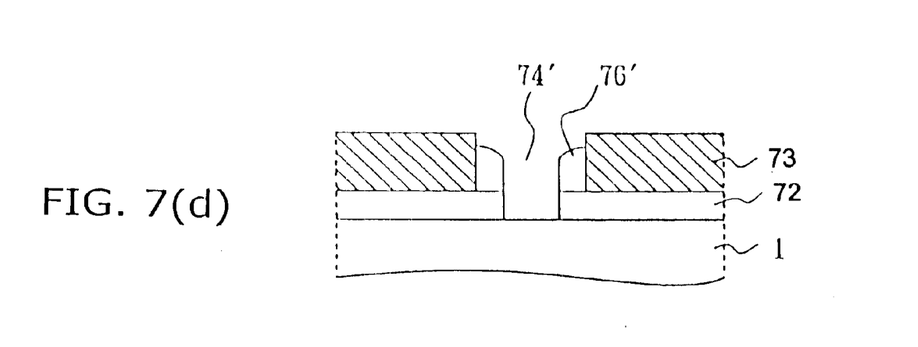

In FIG. 7(d), a blanket etchback process is applied to form a final contact pattern 74'.

In this embodiment, too, the contact pattern 74 does not reach the silicon substrate 1 so that little damage is made to the substrate 1 by the first etching. Since etching is made under the etching conditions of the SiN film 73, a portion of the $SiO_2$ film 72 can be left with higher precision than that of the second embodiment by the fact that the etching speed is different between the SiN film 73 and the $SiO_2$ film 72.

In addition, it is possible to reduce the reduction of the interlayer insulation film 62' of the second embodiment in the blanket etchback process because the entire surface except for the contact pattern 74 is the SiN film. The $SiO_2$ films 76' on the side walls of the contact pattern 74' are rounded at shoulders but present no structural problem.

The fourth embodiment will be described with reference to FIGS. 8(a)–(d).

Figure 8A:
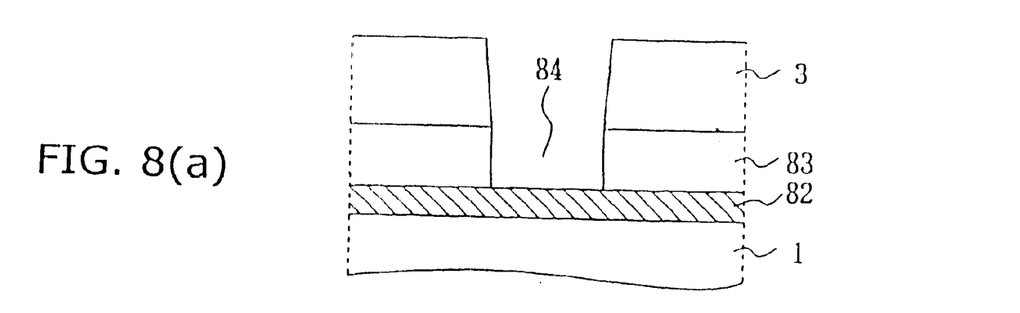
FIGS. 8(a)–(d) are sectional views showing steps of making an LSI device according to the fourth embodiment of the invention.

In FIG. 8(a), reference numeral 1 denotes a semiconductor substrate, 82 a first interlayer insulation film or SiN film having a thickness of 200–4000 Å, 83 a second interlayer insulation film or $SiO_2$ film having a thickness of 1000–6000 Å, and 3 a photoresist film. A contact pattern 84 is not formed for the first interlayer insulation film or SiN film 82 but the $SiO_2$ film 83.

Figure 8B:
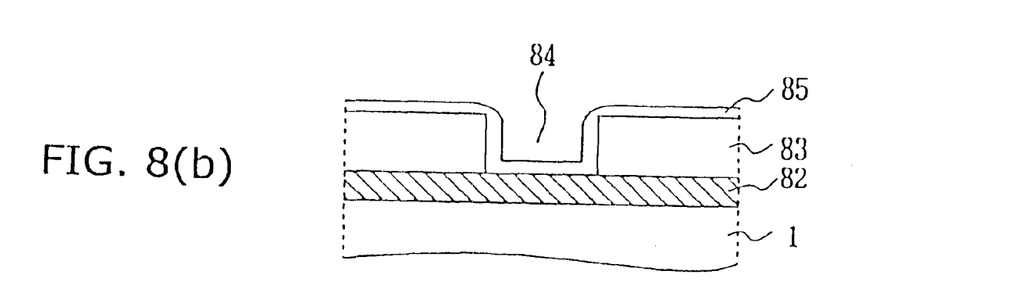

In FIG. 8(b), the photoresist film 3 is removed, and a Silicon film 85 is formed on the entire surface as in FIG. 1(b).

Figure 8C:
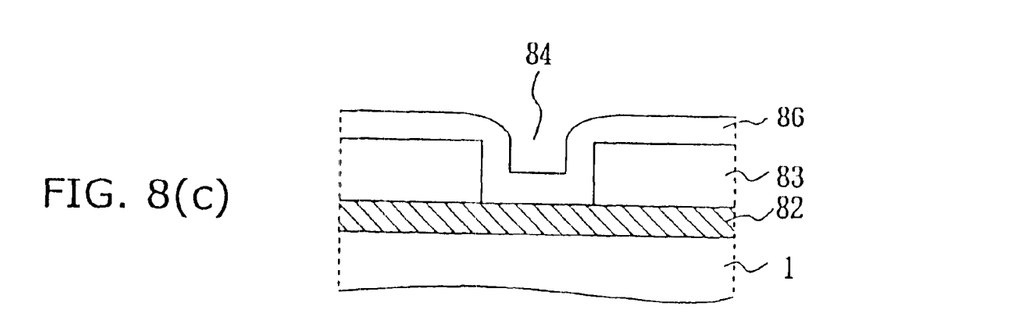

In FIG. 8(c), the silicon film 85 is oxidized by heat treatment to form a $SiO_2$ film 86 as in FIG. 1(c).

Figure 8D:
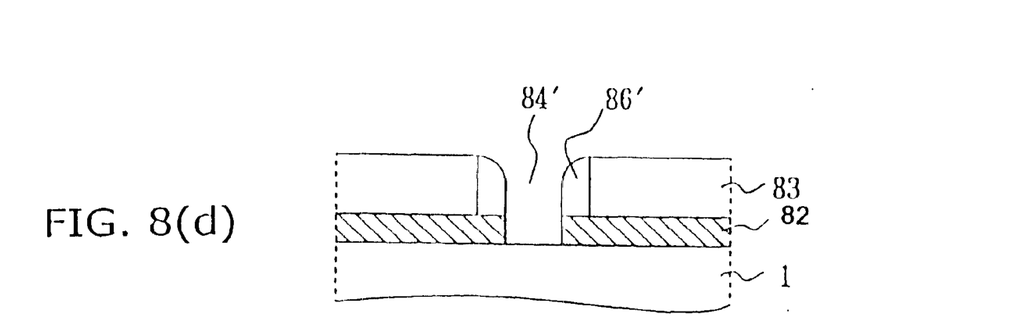

In FIG. 8(d), a blanket etchback process is applied, and an etching process is applied to the first interlayer insulation film or SiN film 82 through the $SiO_2$ film 83 to form a final contact pattern 84'.

Since the contact pattern 84 does not reach the silicon substrate 1, little damage is made to the substrate at the first etching. Since the etching treatment is applied to the SiN film 82 with the $SiO_2$ film 83 as a masking material, the loss of shoulders of the $SiO_2$ films 86' on the side walls of the contact pattern 84' is less than that of the $SiO_2$ film 76' in the third embodiment. The first interlayer insulation film or SiN film 82 is in contact with the silicon substrate 1 so that the difference in etching speed between the SiN film 82 and the silicon substrate 1 can be lower than that between the $SiO_2$ film 86 and the silicon substrate 1. Consequently, the silicon substrate 1 can be etched slightly, which, however, presents no problem.

The fifth embodiment will be described with reference to FIGS. 9(a)–(d).

Figure 9A:
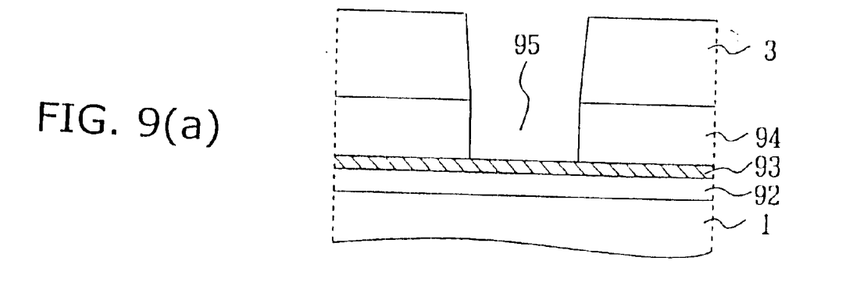

In FIG. 9(a), reference numeral 1 is a semiconductor substrate, 92 a first interlayer insulation film or $SiO_2$ film of having a thickness of 500–2000 Å, 93 a second interlayer insulation film or SiN film having a thickness of 200–4000 Å, and 94 a third interlayer insulation film or $SiO_2$ film having a thickness of 1000–6000 Å. Reference numeral 3 is a photoresist film, and 95 a contact pattern. The contact pattern 95 is not formed in the first interlayer insulation film 92 and the second interlayer insulation film 93 but the third interlayer insulation film 94.

Figure 9B:
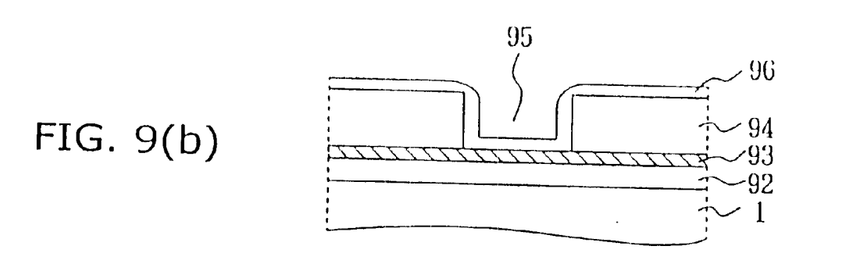

In FIG. 9(b), the photoresist film 3 is removed, and a silicon film 96 is formed on the entire surface as in FIG. 1(b).

Figure 9C:
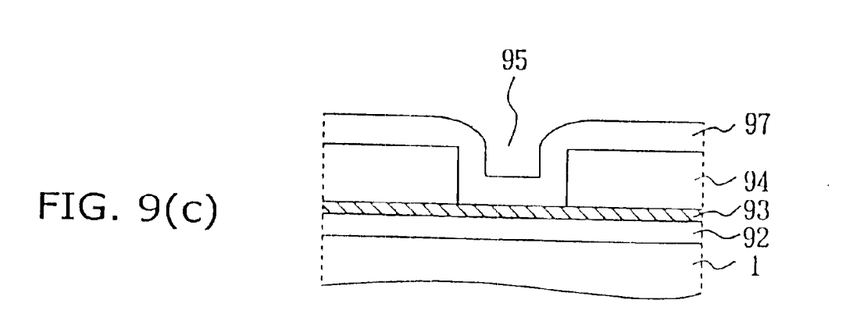

In FIG. 9(c), the silicon film 96 is oxidized by heat treatment to form a $SiO_2$ film 97 as in FIG. 1(c).

Figure 9D:
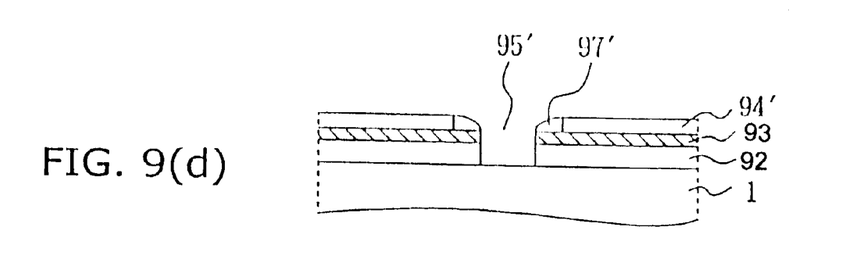

In FIG. 9(d), a blanket etchback process is applied, and the third interlayer insulation film or $SiO_2$ film 94 is used as a masking material to etch the second interlayer insulation film or SiN film 93, and the $SiO_2$ film 92 is used as a masking material to etch the first interlayer insulation film or $SiO_2$ film 92 to form a final contact pattern 95'.

In this embodiment, too, the contact pattern 95 does not reach the silicon substrate 1 so that the first etching does not damage the substrate 1. When the final contact pattern (side wall SiO₂ film) 97' is made, the cut by etching of the silicon substrate 1 is less than that of the fifth embodiment because the second interlayer insulation film or SiN film 93 does not reach the silicon substrate 1. When the final contact pattern 95' is formed, the SiO₂ film 94 is used as a masking material to etch the second interlayer insulation film or SiN film 93 and the first interlayer insulation film or SiO₂ film 92 so that the third interlayer insulation film 94' after the etching process is somewhat thinner. However, this problem is solved simply by increasing the initial thickness of the third interlayer insulation film 94.

The sixth embodiment of the invention will be described with reference to FIGS. 10(a)–(d).

Figure 10A:
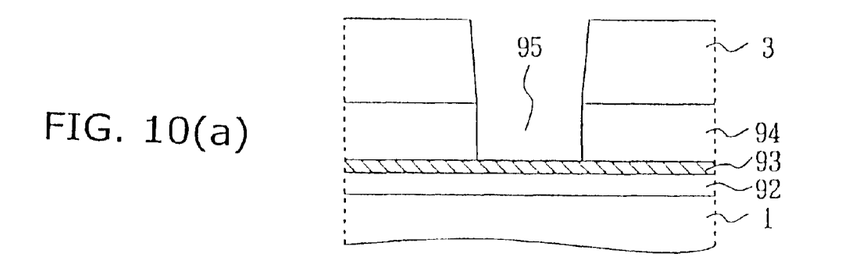
FIGS. 10(a)–(d) are sectional views showing steps of making an LSI device according to the sixth embodiment of the invention.

In FIG. 10(a), reference numeral 1 denotes a semiconductor substrate, 92 a first interlayer insulation film or SiO₂ film having a thickness of 500–2000 Å, 93 a second interlayer insulation film or SiN film having a thickness of 200–4000 Å, 94 a third interlayer insulation film or SiO₂ film having a thickness of 1000–6000 Å, and 3 a photoresist film. A contact pattern 95 is not formed in the first and second interlayer insulation films 92 and 93 but the SiO₂ film 94 in the same manner as in the fifth embodiment.

Figure 10B:
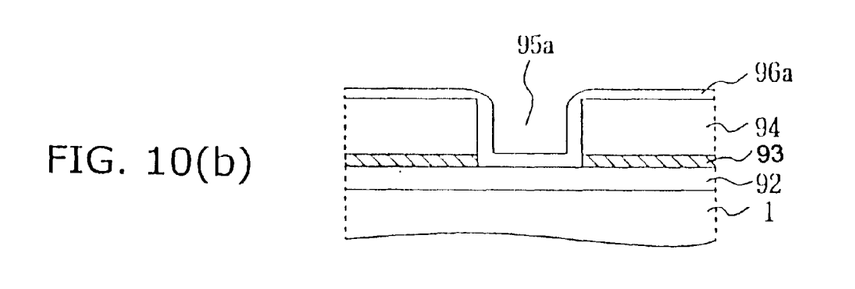

In FIG. 10(b), the second interlayer insulation film 93 is etched, and a contact pattern 95a is formed. Then, the photoresist film 3 is removed, and a silicon film 96a is formed on the entire surface as in FIG. 9(b).

Figure 10C:
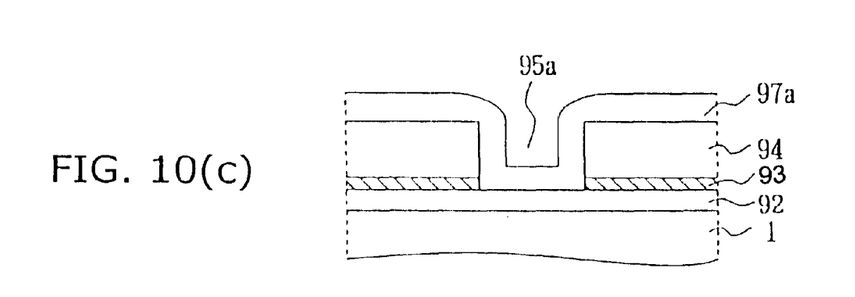

In FIG. 10(c), the silicon film 96a is oxidized by a heat treatment to provide a SiO₂ film 97a as in FIG. 9(c).

Figure 10D:
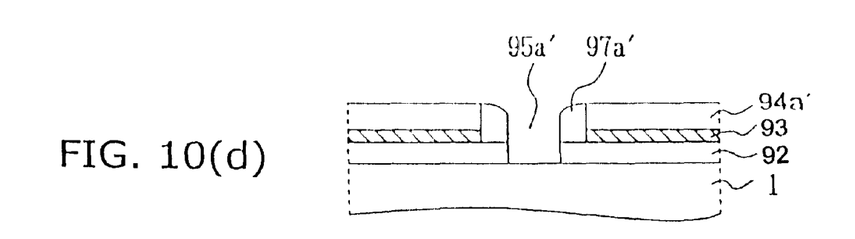

In FIG. 10(d), an overall etchback process is applied so that the first interlayer insulation film or SiO₂ film 92 is etched to provide a final contact pattern 95a'.

Since the first contact pattern 95 does not reach the silicon substrate 1 so that little damage is made to the substrate 1 by the first etching. The second interlayer insulation film or SiN film 93 has been removed in the step FIG. 10(b) prior to formation of the final contact pattern or side wall SiO₂ films 97a' so that, as shown by 94a' in FIG. 10(d), it is possible to minimize such reduction in the third interlayer insulation films 94' as shown in FIG. 9(d).

The invention is not limited to the above embodiments but various modifications are possible without departing from the sprit of the invention and, therefore, it should be understood that they fall within the scope of the appended claims.

The advantages of the invention are as follows.

(A) The dimension of the etched contact pattern formed on the insulation film is reduced without changing the lithographic technique.

(B) The frequency of LSI failure owing to offset of the photoresist pattern formed by the lithographic technique is reduced.

(C) The frequency of LSI failure owing to too large the dimension of the photoresist pattern formed by the lithographic technique is reduced.

(D) The frequency of poor opening occurrences owing to variations in formation of the side wall SiO₂ film on the inside walls of a contact pattern is reduced.

(E) The damage to the silicon substrate exposed by the etching process in formation of the side wall SiO₂ film on the inside walls of a contact pattern is reduced.

(F) The process margins for the poor opening and the etching damage to the silicon substrate in formation of the side wall SiO₂ film on the inside walls of a contact pattern is maximized.

(G) The invention is adaptable to the double or triple layer structures.

What is claimed is:

1. A method of forming a semiconductor device, comprising:

providing a semiconductor substrate having a surface, wherein the semiconductor substrate contains silicon;

forming an insulating film on the surface of the semiconductor substrate;

forming a contact hole in the insulating film such that the contact hole does not reach the surface of the semiconductor substrate;

forming a layer containing silicon on the insulating film including inside surfaces of the contact hole;

transforming the layer into an oxide layer by heat treatment; and etching the oxide layer such that a portion of the oxide layer remains on side surfaces of the contact hole and a part of the surface of the semiconductor substrate is exposed.

2. A method of forming a semiconductor device, comprising:

providing a semiconductor substrate having a surface, wherein the semiconductor substrate contains silicon;

forming a first insulating film made of an oxide film on the surface of the semiconductor substrate;

forming a second insulating film made of a nitride film on the first insulating film;

forming a contact hole in the second insulating film so as to expose a portion of the first insulating film;

forming a layer containing silicon on the second insulating film including inside surfaces of the contact hole;

transforming the layer into an oxide layer by heat treatment; and etching the oxide layer and the first insulating film simultaneously such that a portion of the oxide layer remains on side surfaces of the contact hole and a part of the surface of the semiconductor substrate is exposed.

3. A method of forming a semiconductor device, comprising:

providing a semiconductor substrate having a surface, wherein the semiconductor substrate contains silicon;

forming a first insulating film made of a nitride film on the surface of the semiconductor substrate;

forming a second insulating film made of an oxide film on the first insulating film;

forming a contact hole in the second insulating film so as to expose a portion of the first insulating film;

forming a layer containing silicon on the second insulating film including inside surfaces of the contact hole;

transforming the layer into an oxide layer by heat treatment;

etching the oxide layer such that a portion of the oxide layer remains on side surfaces of the contact hole; and etching the first insulating film such that a part of the surface of the semiconductor substrate is exposed.

4. A method of forming a semiconductor device, comprising:

providing a semiconductor substrate having a surface, wherein the semiconductor substrate contains silicon;

forming a first insulating film made of an oxide film on the surface of the semiconductor substrate;

forming a second insulating film made of a nitride film on the first insulating film;

forming a third insulating film made of an oxide film on the second insulating film;

forming a contact hole in the third insulating film so as to expose a portion of the second insulating film;

forming a layer containing silicon on the third insulating film including inside surfaces of the contact hole;

transforming the layer into an oxide layer by heat treatment;

etching the oxide layer such that a portion of the oxide layer remains on side surfaces of the contact hole; and etching the first and second insulating films such that a part of the surface of the semiconductor substrate is exposed.

5. A method of forming a semiconductor device, comprising:

providing a semiconductor substrate having a surface, wherein the semiconductor substrate contains silicon;

forming a first insulating film made of an oxide film on the surface of the semiconductor substrate;

forming a second insulating film made of a nitride film on the first insulating film;

forming a third insulating film made of an oxide film on the second insulating film;

forming a contact hole in the second and third insulating films so as to expose a portion of the first insulating film;

forming a layer containing silicon on the third insulating film including inside surfaces of the contact hole;

transforming the layer into an oxide layer by heat treatment;

etching the oxide layer and the first insulating film simultaneously such that a portion of the oxide layer remains on side surfaces of the contact hole and a part of the surface of the semiconductor substrate is exposed.

* * * * *